(12) United States Patent
Chang et al.

(10) Patent No.: US 10,361,080 B2
(45) Date of Patent: Jul. 23, 2019

(54) PATTERNING METHOD

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 100 days.

(21) Appl. No.: 15/641,235

(22) Filed: Jul. 4, 2017

(65) Prior Publication Data
US 2019/0013201 A1  Jan. 10, 2019

(51) Int. Cl.
| | |
|---|---|
| *H01L 21/3105* | (2006.01) |
| *H01L 21/311* | (2006.01) |
| *H01L 21/033* | (2006.01) |
| *H01L 27/108* | (2006.01) |
| *H01L 21/3213* | (2006.01) |

(52) U.S. Cl.
CPC ...... *H01L 21/0338* (2013.01); *H01L 21/0332* (2013.01); *H01L 21/0335* (2013.01); *H01L 27/10894* (2013.01); *H01L 21/0337* (2013.01); *H01L 21/32139* (2013.01)

(58) Field of Classification Search
CPC ............... H01L 21/31116; H01L 21/31144
See application file for complete search history.

(56) References Cited

U.S. PATENT DOCUMENTS

| | | | |
|---|---|---|---|
| 7,115,525 B2 * | 10/2006 | Abatchev | H01L 21/0332 438/725 |
| 9,041,122 B2 | 5/2015 | Yoo | |
| 9,318,564 B2 | 4/2016 | Mojumder | |
| 9,349,724 B2 | 5/2016 | Kim | |
| 2006/0263699 A1 * | 11/2006 | Abatchev | H01L 21/0337 430/5 |
| 2013/0200498 A1 | 8/2013 | Mangan | |
| 2013/0271938 A1 * | 10/2013 | Lindert | H05K 1/182 361/782 |
| 2016/0035578 A1 | 2/2016 | Lupo | |

* cited by examiner

*Primary Examiner* — Thomas T Pham
(74) *Attorney, Agent, or Firm* — Winston Hsu

(57) ABSTRACT

A patterning method is disclosed. A hard mask layer, a lower pattern transfer layer, an upper pattern transfer layer are formed on a target layer. A first SARP process is performed to pattern the upper pattern transfer layer into an upper pattern mask. A second SARP process is performed to pattern the lower pattern transfer layer into a lower pattern mask. The upper pattern mask and the lower pattern mask define hole patterns. The hole patterns is filled with a dielectric layer. The dielectric layer and the upper pattern mask are etched back until the lower pattern mask is exposed. The lower pattern mask is removed, thereby forming island patterns. Using the island patterns as an etching hard mask, the hard mask layer is patterned into hard mask patterns. Using the hard mask patterns as an etching hard mask, the target layer is patterned into target patterns.

13 Claims, 19 Drawing Sheets

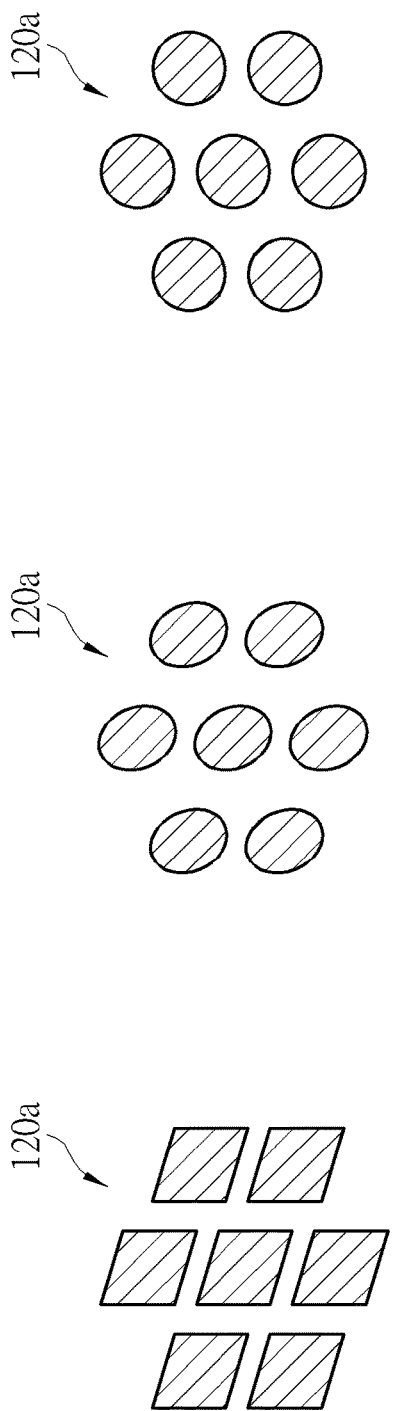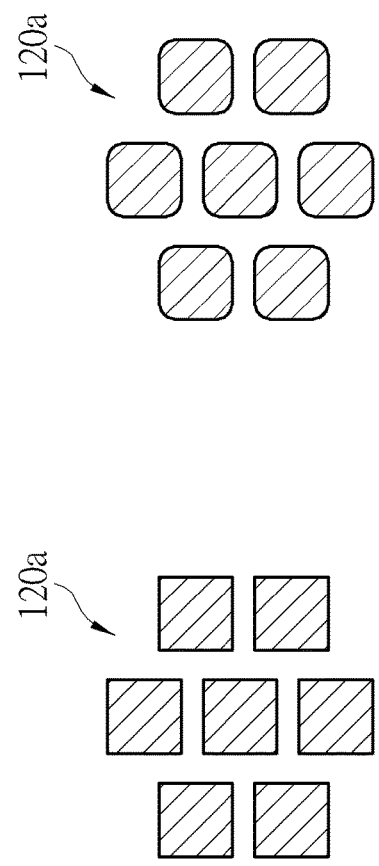

PATTERNING METHOD

BACKGROUND OF THE INVENTION

1. Field of the Invention

The present invention relates generally to the field of integrated circuit manufacturing. More particularly, the present invention relates to a patterning method for forming integrated circuit features on a wafer with improved manufacturability.

2. Description of the Prior Art

Integrated circuit (IC) dimensions are desired to be constantly scaled down with advancement of technology. Integrated circuit features are traditionally patterned via photolithographic processes. However, the current photolithography technology is reaching its limit of resolution.

As the degree of integration of semiconductor devices increases, it may be difficult to form ultrafine patterns using photolithography processes that exceed the limit of resolution. There is always a need in this industry to provide a resolution enhancement method for optical lithography with improved manufacturability

SUMMARY OF THE INVENTION

It is one object of the invention to provide a patterning method for forming integrated circuit features on a wafer with improved manufacturability.

According to one aspect of the invention, a patterning method is disclosed. A substrate having thereon a target layer is provided. A hard mask layer is formed on the target layer. A lower pattern transfer layer is formed on the hard mask layer. An upper pattern transfer layer is formed on the lower pattern transfer layer. A first self-aligned reverse patterning (SARP) process is performed to pattern the upper pattern transfer layer into an upper pattern mask on the lower pattern transfer layer. A second self-aligned reverse patterning (SARP) process is performed to pattern the lower pattern transfer layer into a lower pattern mask. The upper pattern mask and the lower pattern mask together define an array of hole patterns. The array of hole patterns is filled with an organic dielectric layer. The organic dielectric layer and the upper pattern mask are etched back until the lower pattern mask is exposed. The lower pattern mask is removed, leaving remnants of the organic dielectric layer on the hard mask layer to form island patterns. Using the island patterns as an etching hard mask, the hard mask layer is patterned into hard mask patterns. Using the hard mask patterns as an etching hard mask, the target layer is patterned into target patterns.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1A to FIG. 13A are schematic top-view diagrams showing an exemplary patterning method for forming semiconductor features on a substrate according to one embodiment of the invention.

FIG. 1B to FIG. 13B are schematic, cross-sectional diagrams taken along line I-I' in FIG. 1A to FIG. 12A, respectively.

FIG. 25 to FIG. 29 illustrate various shapes of the storage node pads in the cell array region 101 according to embodiments of the invention.

DETAILED DESCRIPTION

Figure 1A:
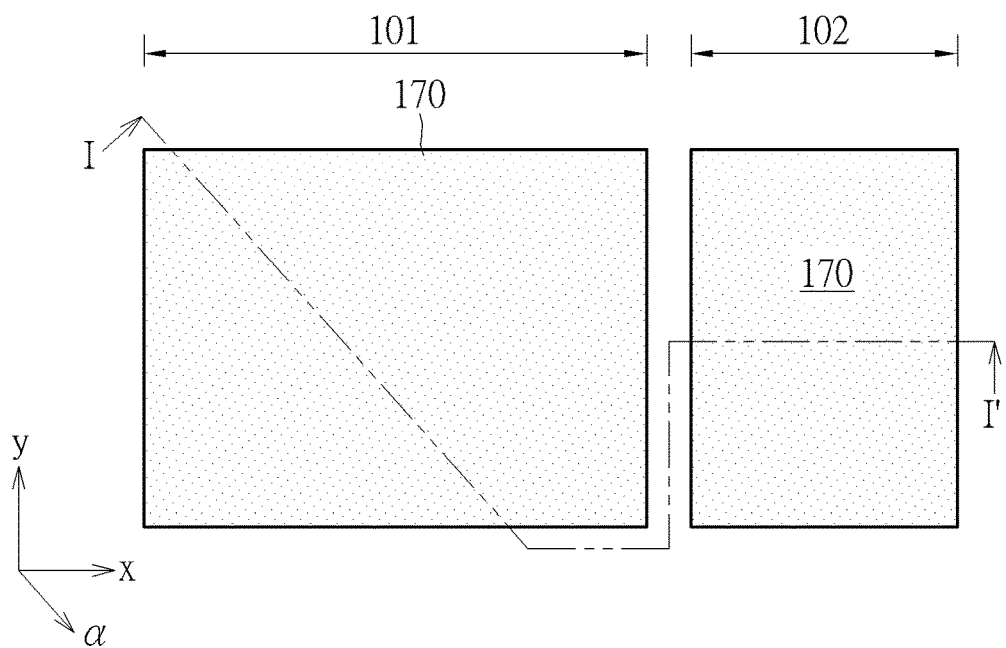

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

Before the further description of the preferred embodiment, the specific terms used throughout the text will be described below.

The term "etch" is used herein to describe the process of patterning a material layer so that at least a portion of the material layer after etching is retained. For example, it is to be understood that the method of etching silicon involves patterning a mask layer (e.g., photoresist or hard mask) over silicon and then removing silicon from the area that is not protected by the mask layer. Thus, during the etching process, the silicon protected by the area of the mask will remain.

In another example, however, the term "etch" may also refer to a method that does not use a mask, but leaves at least a portion of the material layer after the etch process is complete. The above description is used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The terms "forming", "depositing" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

According to various embodiments, for example, deposition may be carried out in any suitable known manner. For example, deposition may include any growth, plating, or transfer of material onto the substrate. Some known techniques include physical vapor deposition (PVD), chemical vapor deposition (CVD), electrochemical deposition (ECD), molecular beam epitaxy (MBE), atomic layer deposition (ALD), and plasma enhanced CVD (PECVD).

The term "substrate" described in the text is commonly referred to as a silicon substrate. However, the substrate may also be any semiconductor material, such as germanium, gallium arsenide, indium phosphide and the like. In other embodiments, the substrate may be non-conductive, such as glass or sapphire wafers.

The present invention pertains to a patterning method for forming semiconductor features such as dense lines, spaces, vias, or pads on a substrate or wafer. In an exemplary embodiment, as will be described in more detail below, a patterning method for forming dense storage node (SN) pads in the cell array region of a dynamic random access memory (DRAM) device is disclosed.

Please refer to FIG. 1A to FIG. 13A and FIG. 1B to FIG. 13B. FIG. 1A to FIG. 13A are schematic top-view diagrams showing an exemplary patterning method for forming semiconductor features on a substrate according to one embodiment of the invention. FIG. 1B to FIG. 13B are schematic, cross-sectional diagrams taken along line I-I' in FIG. 1A to FIG. 13A, respectively.

Figure 1B:
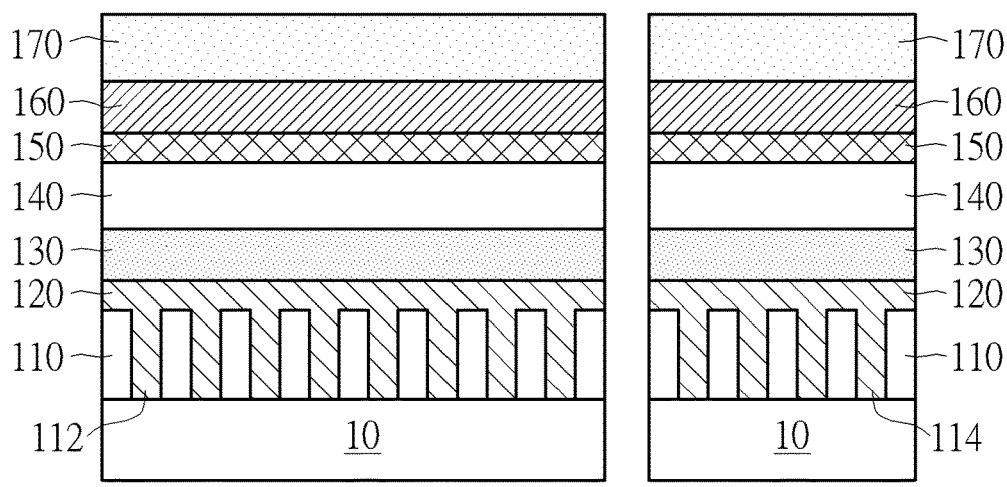

First, as shown in FIG. 1A and FIG. 1B, a substrate 10 is provided. For example, the substrate 10 may comprise a silicon substrate, but is not limited thereto. For the sake of simplicity, only a portion of a cell array region 101 and a portion of a peripheral region 102 are illustrated. Memory cells such as DRAM cells are to be formed within the cell array region 101.

According to one embodiment, the substrate 10 may comprise an inter-layer dielectric layer 110 and contact elements 112 and 114 in the inter-layer dielectric layer 110. The contact elements 112 are disposed in the cell array region 101 and function as storage node contacts. The contact elements 114 are disposed in the peripheral region 102 and may be electrically coupled to terminals (e.g., source terminals, drain terminals, or gate electrodes) of transistors.

According to one embodiment, the inter-layer dielectric layer 110 may comprise a dielectric material such as silicon oxide or silicon nitride, but is not limited thereto. According to one embodiment, the contact elements 112 and 114 may comprise metal such as tungsten.

According to one embodiment, a target layer 120 to be patterned into dense storage node pads in the cell array region 101 is provided on the inter-layer dielectric layer 110. The target layer 120 may comprise metal such as tungsten. The target layer 120 is in direct contact with the contact elements 112 and 114. The target layer 120 is in direct contact with the inter-layer dielectric layer 110. According to one embodiment, the target layer 120 may be deposited on a top surface of the inter-layer dielectric layer 110 in a blanket manner.

According to one embodiment, a hard mask layer 130 is disposed on the target layer 120. For example, the hard mask layer 130 may comprise silicon nitride. According to one embodiment, an advanced patterning film 140 may be disposed on the hard mask layer 130. According to one embodiment, the advanced patterning film 140 may comprise amorphous carbon layer.

An anti-reflection layer 150 may be disposed on the advanced patterning film 140. According to one embodiment, the anti-reflection layer 150 may comprise silicon oxy-nitride (SiON).

According to one embodiment, a lower pattern transfer layer 160 is disposed on the anti-reflection layer 150. An upper pattern transfer layer 170 is disposed on the lower pattern transfer layer 160. For example, the lower pattern transfer layer 160 may comprise polysilicon, and the upper pattern transfer layer 170 may comprise silicon nitride.

Subsequently, as shown in FIG. 2A, FIG. 2B, FIG. 3A, and FIG. 3B, a first self-aligned reverse patterning (SARP) process (or referred to as "reverse self-aligned double patterning"; "reverse SADP") is performed to pattern the upper pattern transfer layer 170 into an upper pattern mask 170a on the lower pattern transfer layer 160.

Figure 2A:
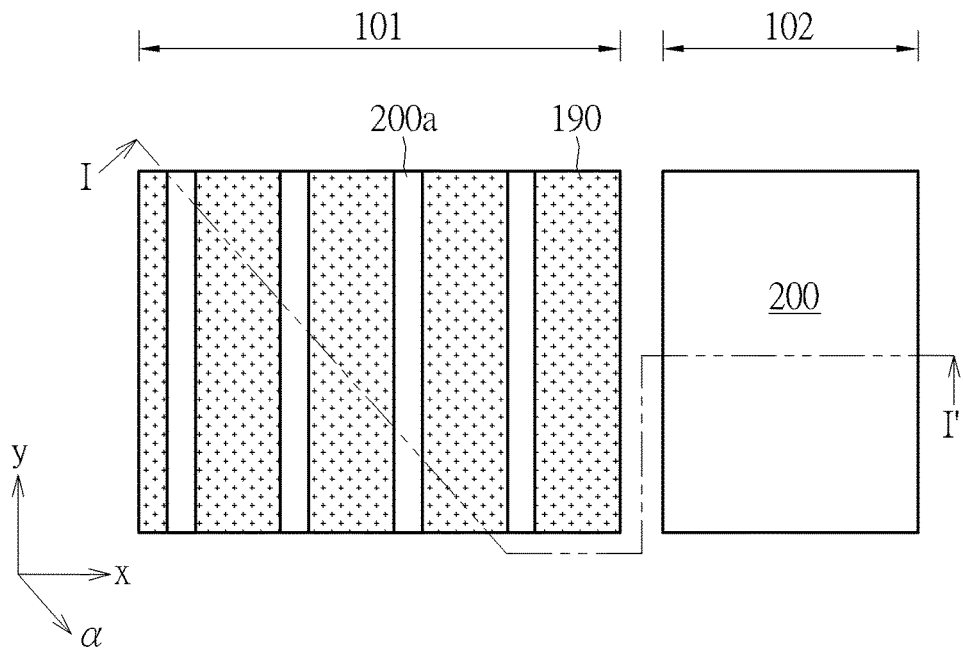
Figure 2B:
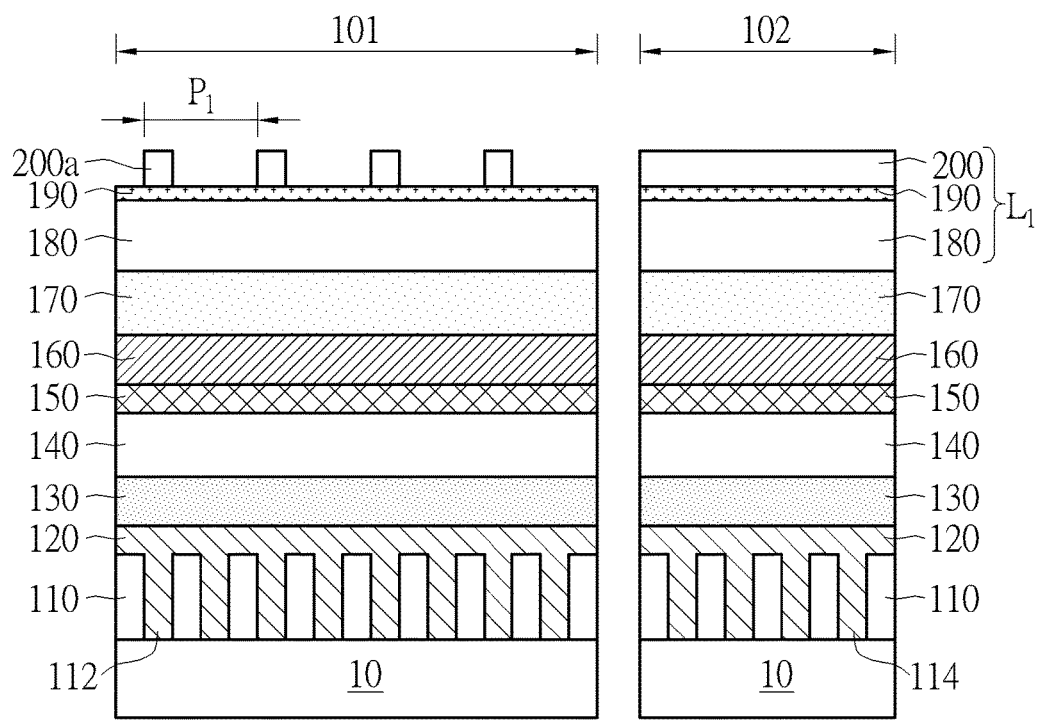

For example, as can be seen in FIG. 2A and FIG. 2B, a first structure layer $L_1$ is formed. The first structure layer $L_1$ includes an organic dielectric layer 180 coated onto the upper pattern transfer layer 170. A bottom anti-reflection coating (BARC) layer 190 such as a silicon-containing spin-on material may be coated on the organic dielectric layer 180. A photoresist layer 200 is formed on the BARC layer 190.

Thereafter, straight-line shaped photoresist patterns 200a, which extend along the reference y-axis and have a pitch $P_1$, may be formed on the BARC layer 190 only within the cell array region 101.

Figure 3A:
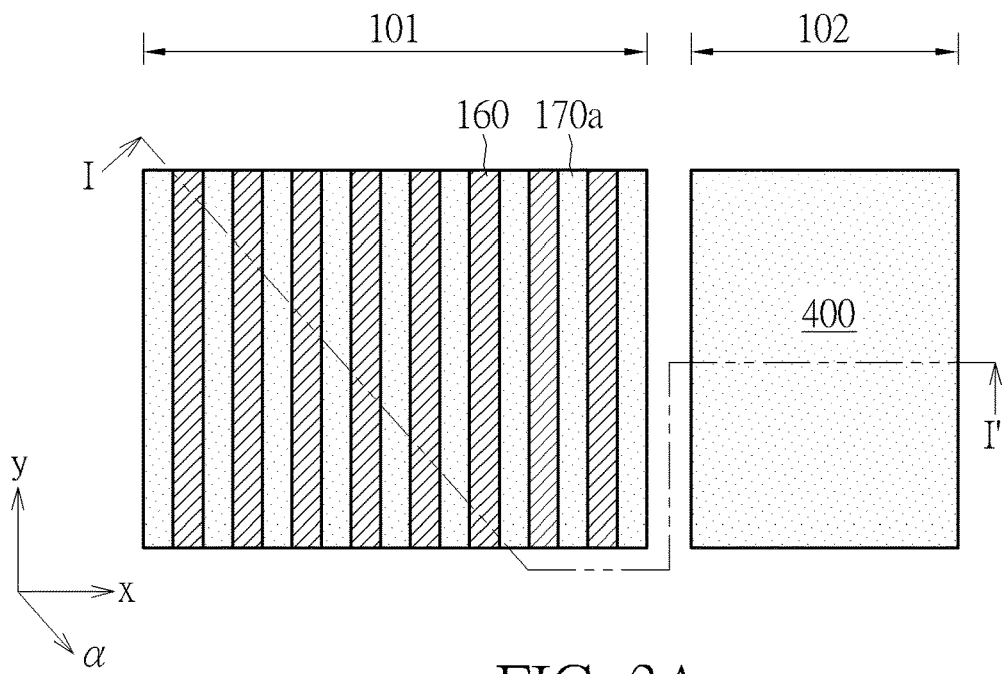
Figure 3B:
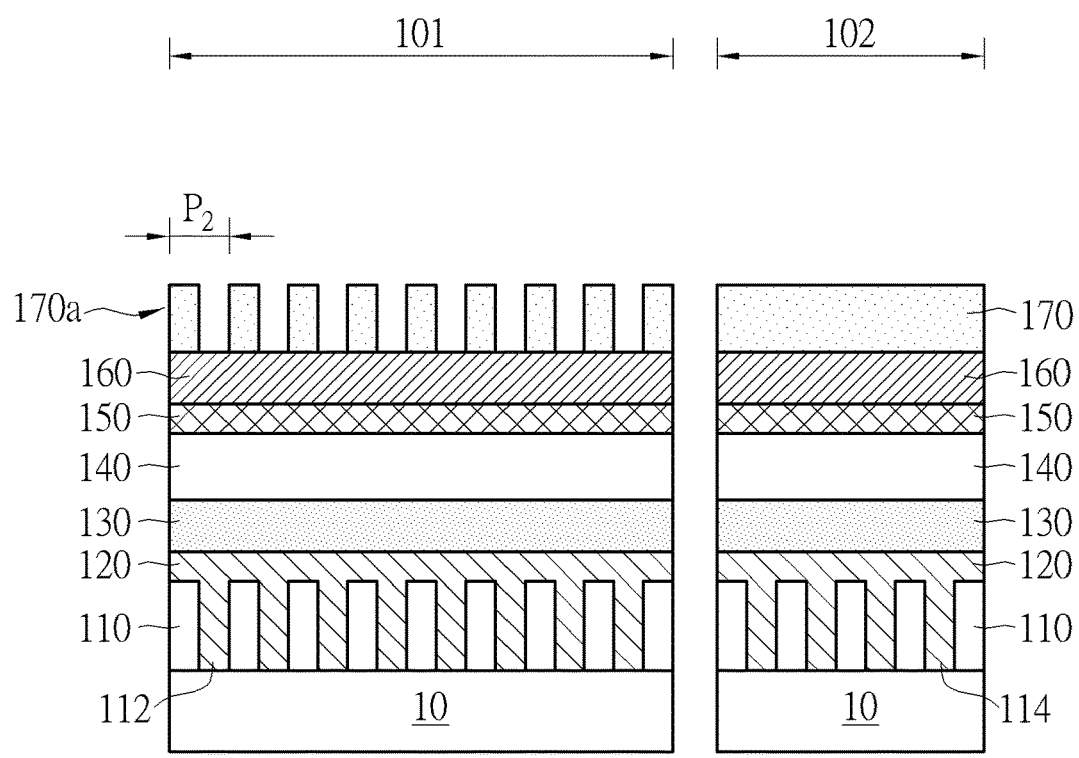
Figure 4A:
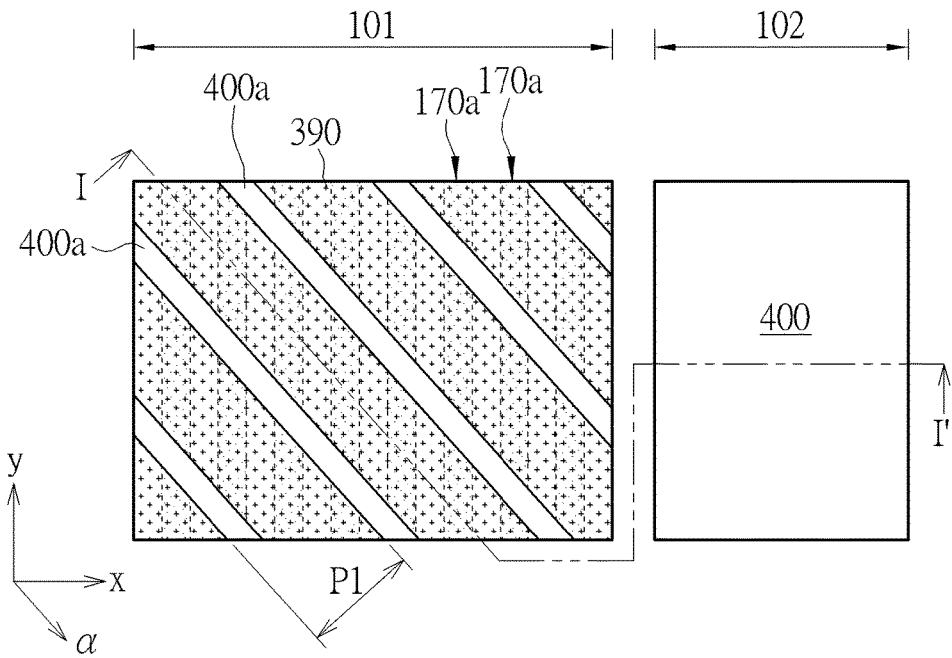
Figure 4B:
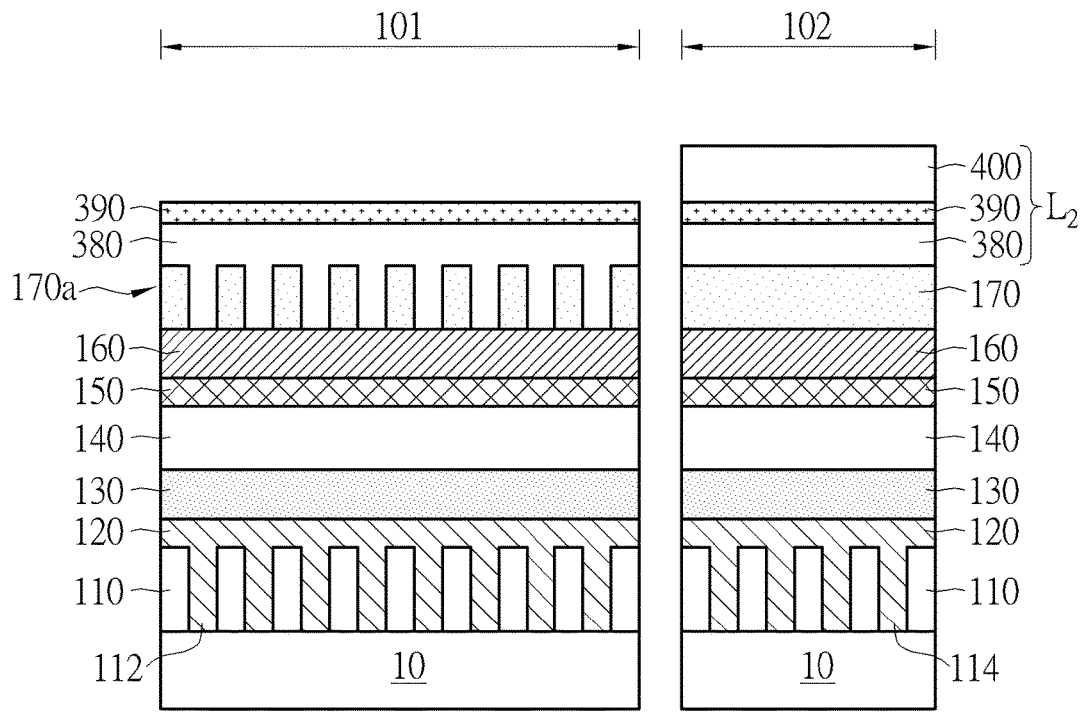

After the first SARP process, as can be seen in FIG. 3A, the upper pattern mask 170a comprises straight-line shaped patterns, which extend along the reference y-axis and have a pitch $P_2$. According to one embodiment, the pitch $P_2$ is smaller than the pitch $P_1$. For example, the pitch $P_2$ is one-half of the pitch $P_1$. It is noteworthy that the upper pattern mask 170a is only formed within the cell array region 101. The upper pattern transfer layer 170 within the peripheral region 102 is not patterned at this stage.

Figure 14:
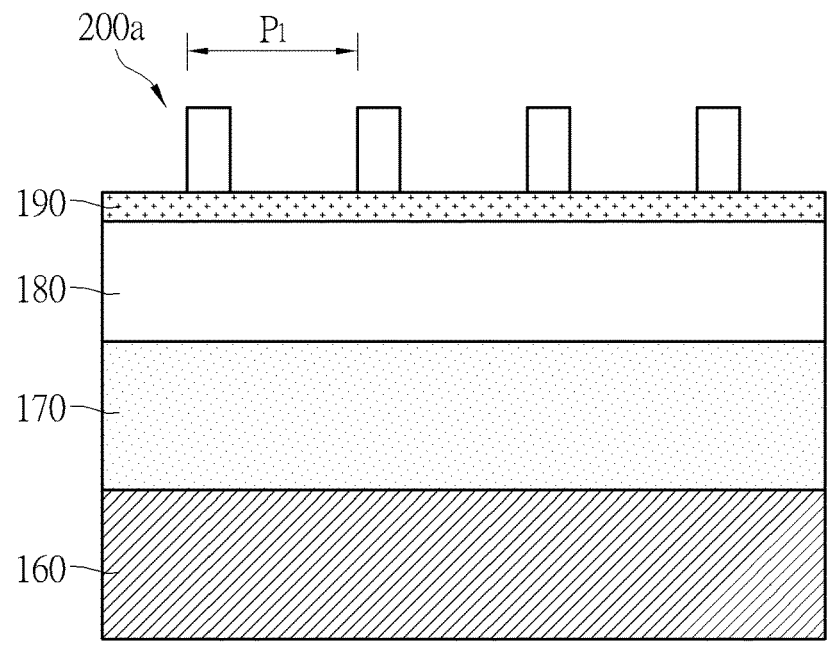
FIG. 14 to FIG. 19 illustrate the steps involved in a first self-aligned reverse patterning (SARP) process.

FIG. 14 to FIG. 19 illustrate the first SARP process in more detail. For the sake of simplicity, through FIG. 14 to FIG. 19, the substrate and layers under the lower pattern transfer layer 160 are omitted. As shown in FIG. 14, as previously described in FIG. 2B, an organic dielectric layer 180 is coated onto the upper pattern transfer layer 170. A bottom anti-reflection coating layer 190 is then formed on the organic dielectric layer 180. Thereafter, straight-line shaped photoresist patterns 200a, which extend along the reference y-axis direction at pitch $P_1$, are formed on the BARC layer 190. The bottom anti-reflection coating layer 190 and the organic dielectric layer 180 are collectively referred to as a first structure layer.

The straight-line shaped photoresist patterns 200a are formed by performing a lithographic process including, but not limited to, photoresist coating, baking, exposure, and development.

Figure 15:
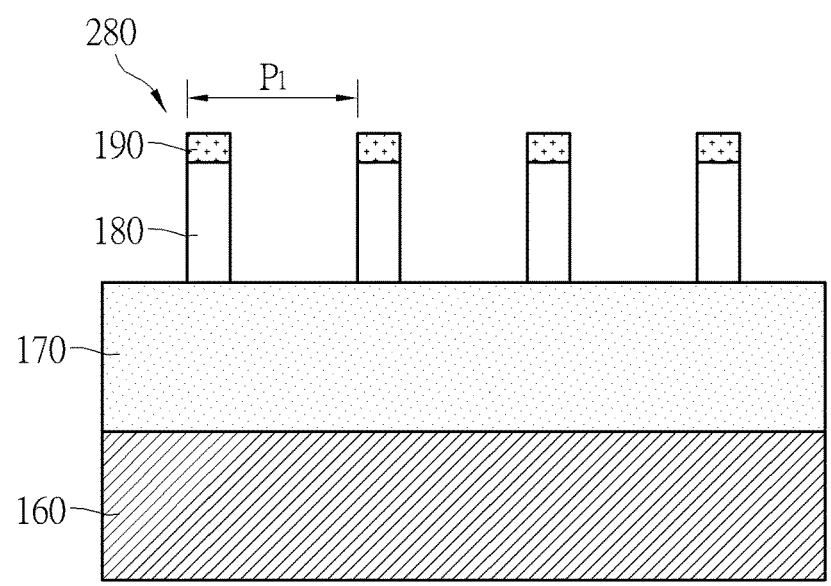

Subsequently, as shown in FIG. 15, using the straight-line shaped photoresist patterns 200a as a hard mask, an anisotropic etching process is performed to etch the first structure layer, to thereby pattern the first structure layer into first straight line-shaped structure patterns 280.

Aligning with the straight-line shaped photoresist patterns 200a, the first straight line-shaped structure patterns 280 also extend along the reference y-axis direction and have the pitch $P_1$.

Figure 16:
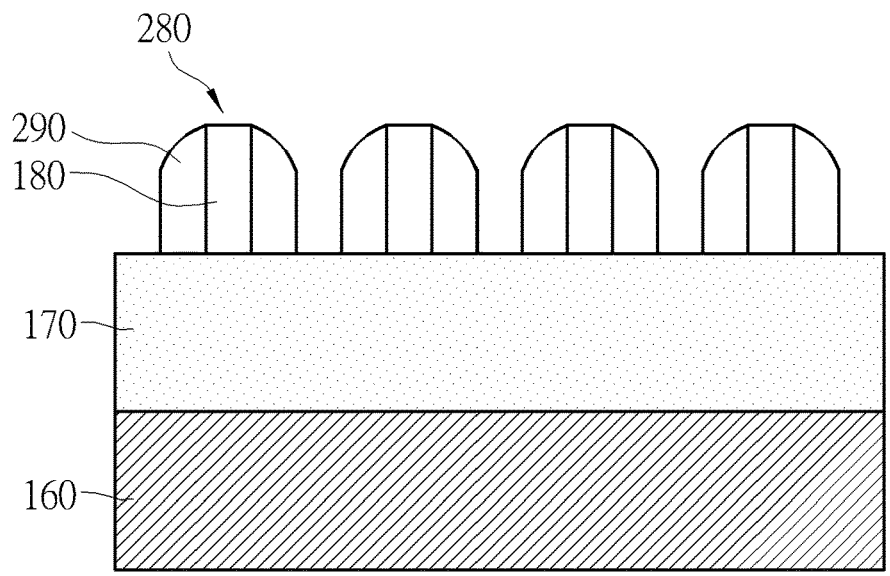

As shown in FIG. 16, first spacers 290 are formed on sidewalls of the first straight line-shaped structure patterns 280, respectively. For example, the first spacers 290 may comprise silicon oxide, but is not limited thereto. To form the first spacers 290, a spacer material layer such as a silicon oxide layer is conformally deposited onto the first straight line-shaped structure patterns 280 in FIG. 15, and an anisotropic dry etching process is performed to etch the spacer material layer.

Figure 17:
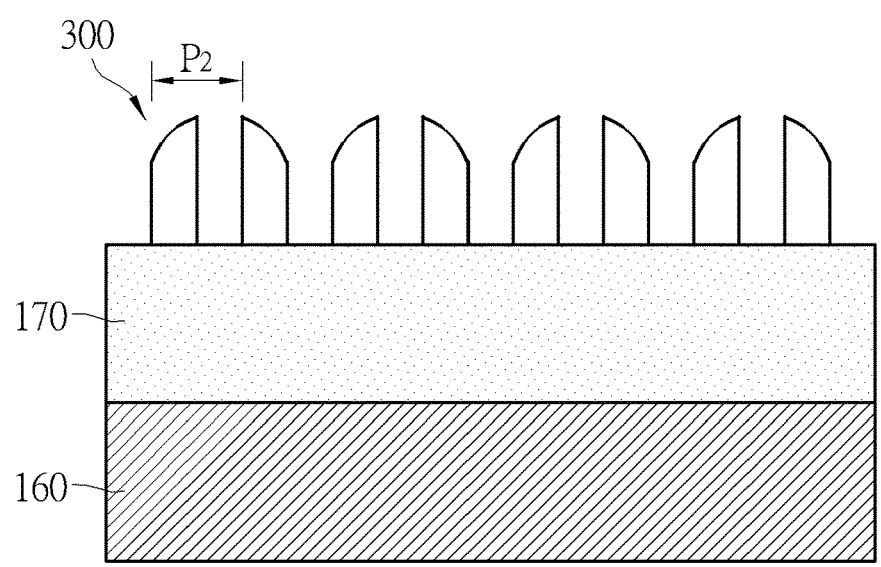

As shown in FIG. 17, the remnants of the first straight line-shaped structure patterns 280 are removed, leaving the first spacers 290 intact. The remnants of the first straight line-shaped structure patterns 280 may be removed by using oxygen plasma ashing process, but is not limited thereto. The first spacers 290 are also straight line-shaped and have a reduced pitch $P_2$.

Figure 18:
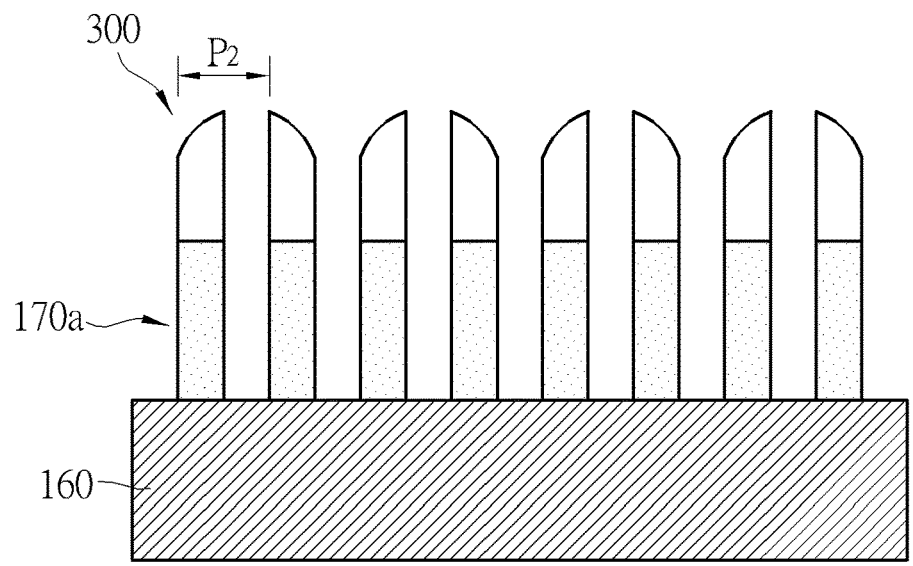

As shown in FIG. 18, using the first spacers 290 as an etching hard mask, an anisotropic dry etching process is performed to etch the upper pattern transfer layer 170 with the pitch $P_2$. At this point, the upper pattern transfer layer 170 is patterned into the upper pattern mask 170a.

Figure 19:
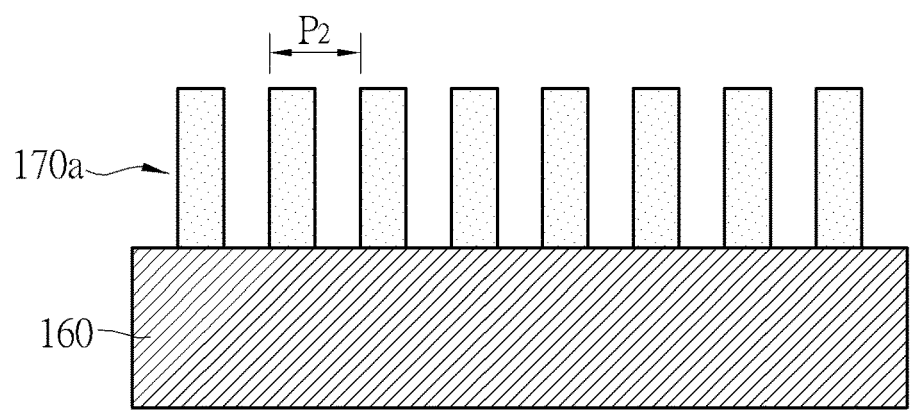

As shown in FIG. 19, after the formation of the upper pattern mask 170a, the remaining first spacers 300 are removed.

Figure 5A:
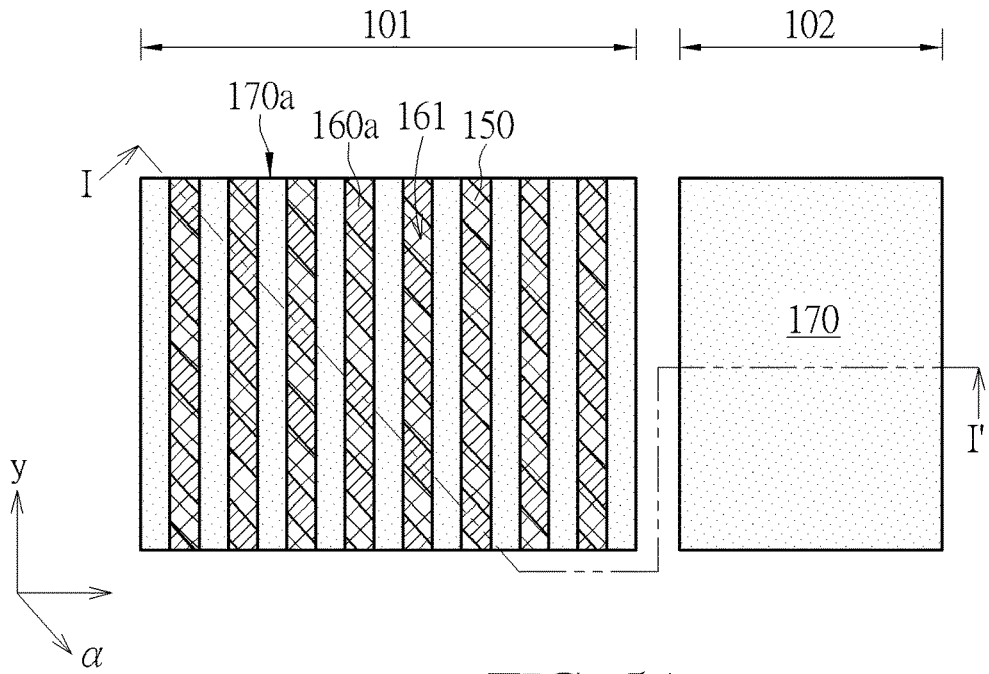
Figure 5B:
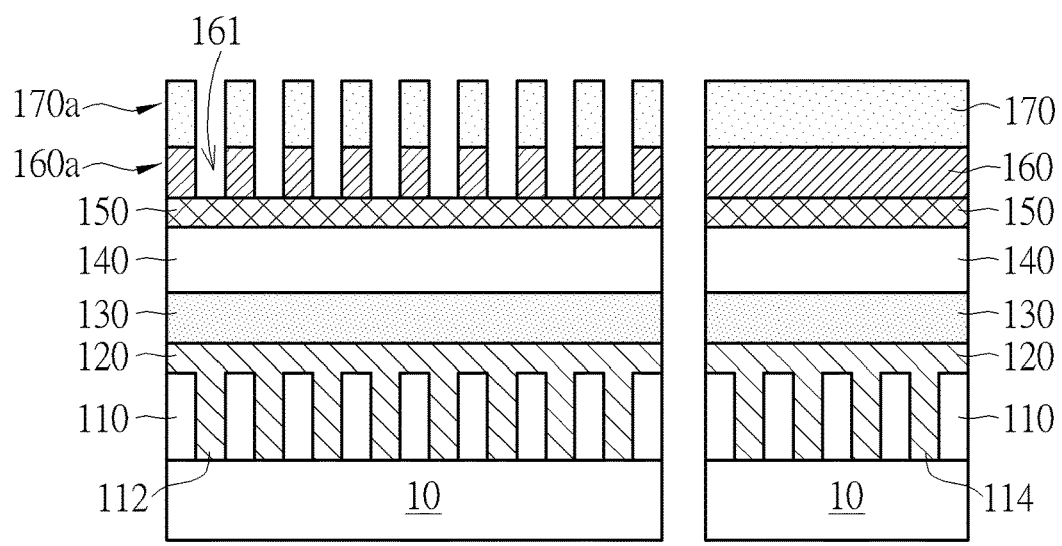
Figure 6A:
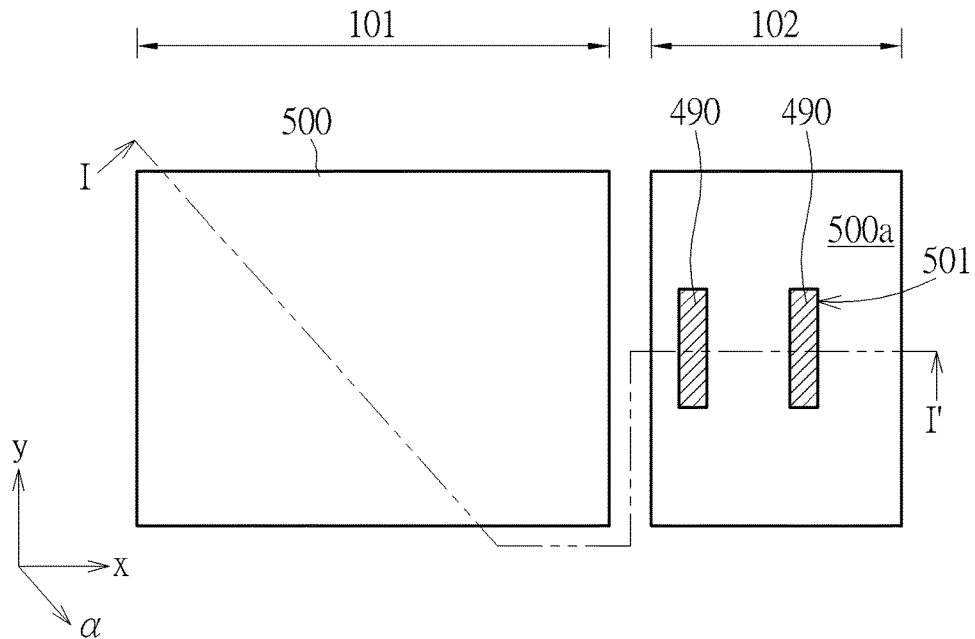
Figure 6B:
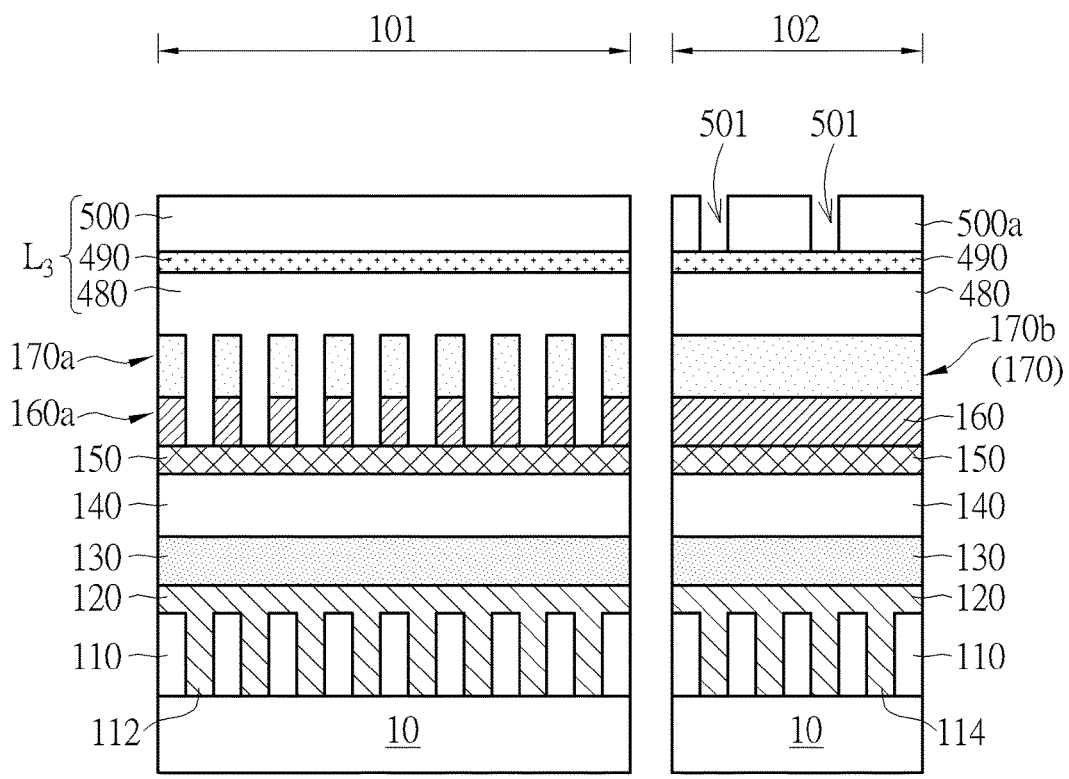

As shown in as shown in FIG. 4A, FIG. 4B, FIG. 5A, and FIG. 5B, a second self-aligned reverse patterning (SARP) process is performed to pattern the lower pattern transfer layer 160 into a lower pattern mask 160a. As shown in FIG. 5A and FIG. 5B, the upper pattern mask 170a and the lower pattern mask 160a together define an array of hole patterns 161.

The second SARP process is similar with the steps as set forth through FIG. 14 to FIG. 19. For example, a second structure layer $L_2$ is formed on the upper pattern mask 170a and on the exposed top surface of the lower pattern transfer layer 160. Likewise, the second structure layer $L_2$ may comprise an organic dielectric layer 380 on the upper pattern mask 170a, a bottom anti-reflection coating layer 390 on the organic dielectric layer 380, and a photoresist layer 400 on the bottom anti-reflection coating layer 390.

Thereafter, straight-line shaped photoresist patterns 400a, which extend along the reference a direction at pitch $P_1$ may be formed on the BARC layer 190 only within the cell array region 101. According to one embodiment, the reference a direction is not perpendicular to the reference y-axis.

Figure 20:
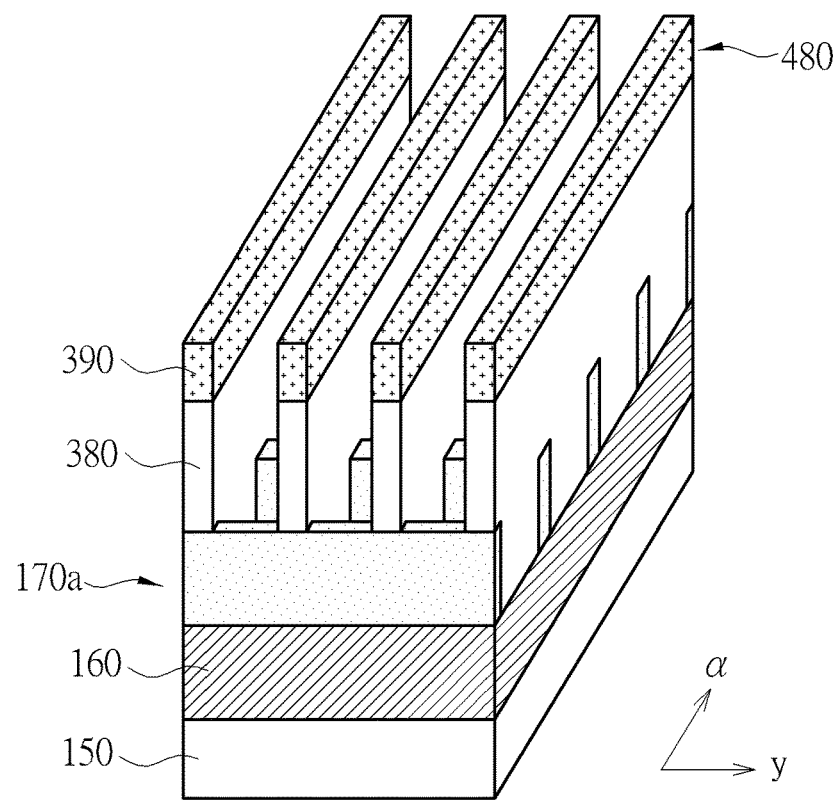
FIG. 20 is a perspective view showing an intermediate mask stack structure in the second SARP process.

Subsequently, as shown in FIG. 20, a lithographic process and an etching process are performed to pattern the second structure layer $L_2$ into second straight line-shaped structure patterns 480 extending along the reference a direction. Subsequently, similar with the steps set forth in FIG. 16, second spacers are formed on sidewalls of the second straight line-shaped structure patterns 480, respectively. Subsequently, similar with the steps set forth in FIG. 17, the second straight line-shaped structure patterns 480 are removed. Then, similar with FIG. 18, using the second spacers and the upper pattern mask 170a as an etching hard mask, the exposed lower pattern transfer layer 160 is etched, thereby forming the lower pattern mask 160a. The second spacers are then removed, similar with FIG. 19.

Figure 21:
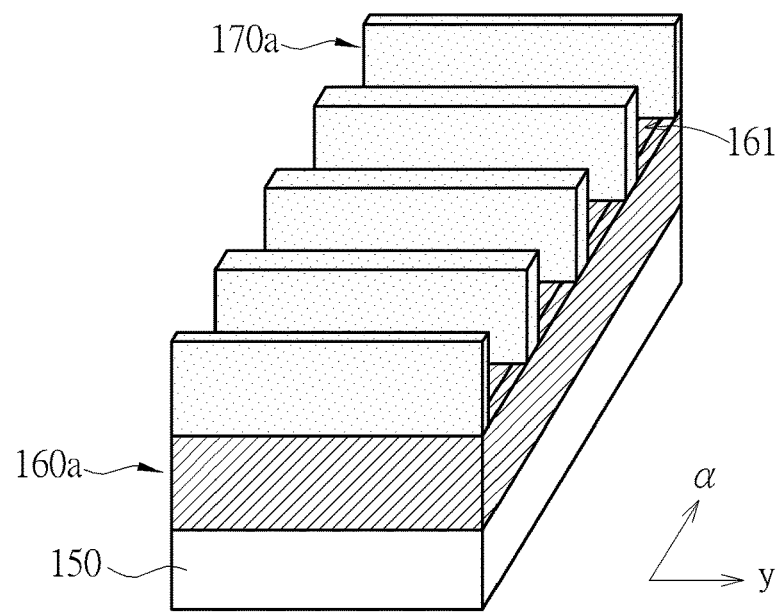
FIG. 21 is a perspective view showing a mask stack structure in the second SARP process.

FIG. 21 is a perspective view showing a mask stack structure in the second SARP process. For the sake of simplicity, the substrate and the layers under the anti-reflection layer 150 are omitted. As shown in FIG. 21, a mask stack structure consisting of the lower pattern mask 160a and the upper pattern mask 170a is formed. The upper pattern mask 170a comprises straight line-shaped patterns extending along the reference y-axis direction, and the lower pattern mask 160a is a lattice pattern. As can be seen in FIG. 5B, at this point, each of the hole patterns 161 may have a rhombus shape when viewed from above.

FIG. 6 to FIG. 9 illustrate the steps for forming patterns in the peripheral region 102. As shown in FIGS. 6A and 6B, a third structure layer $L_3$ is formed on the mask stack structure formed in the second SARP process as shown in FIG. 5A and FIG. 5B. Likewise, the third structure layer $L_3$ may comprise an organic dielectric layer 480 on the upper pattern mask 170a in the cell array region 101 and on the upper pattern transfer layer 170 in the peripheral region 102, a bottom anti-reflection coating layer 490 on the organic dielectric layer 480, and a photoresist layer 500 on the bottom anti-reflection coating layer 490.

By performing a lithographic process, a photoresist pattern 500a is formed within the peripheral region 102. The photoresist pattern 500a includes openings 501 that define a first feature pattern in the peripheral region 102.

Figure 7A:
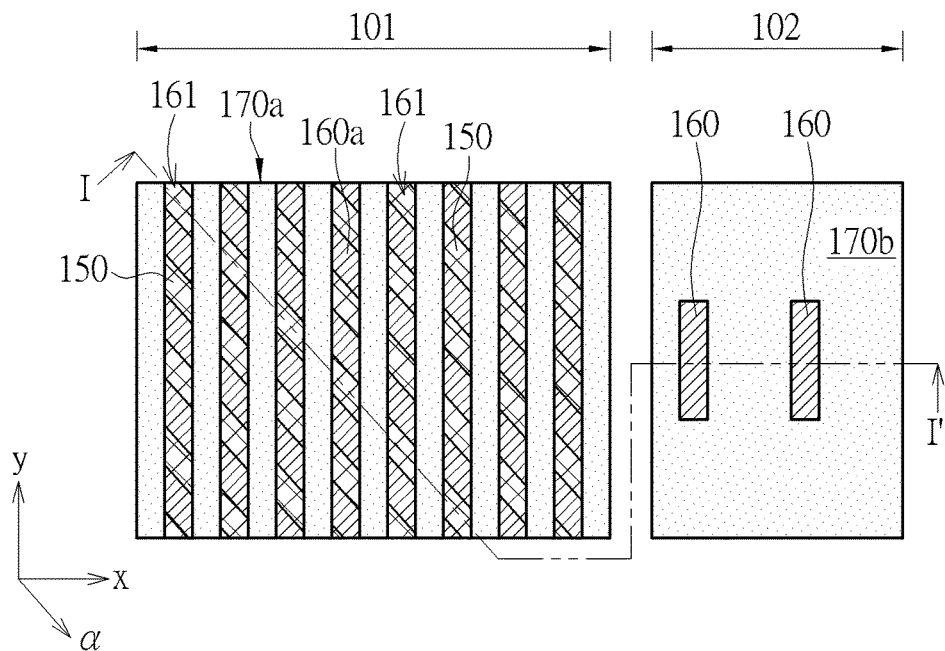
Figure 7B:
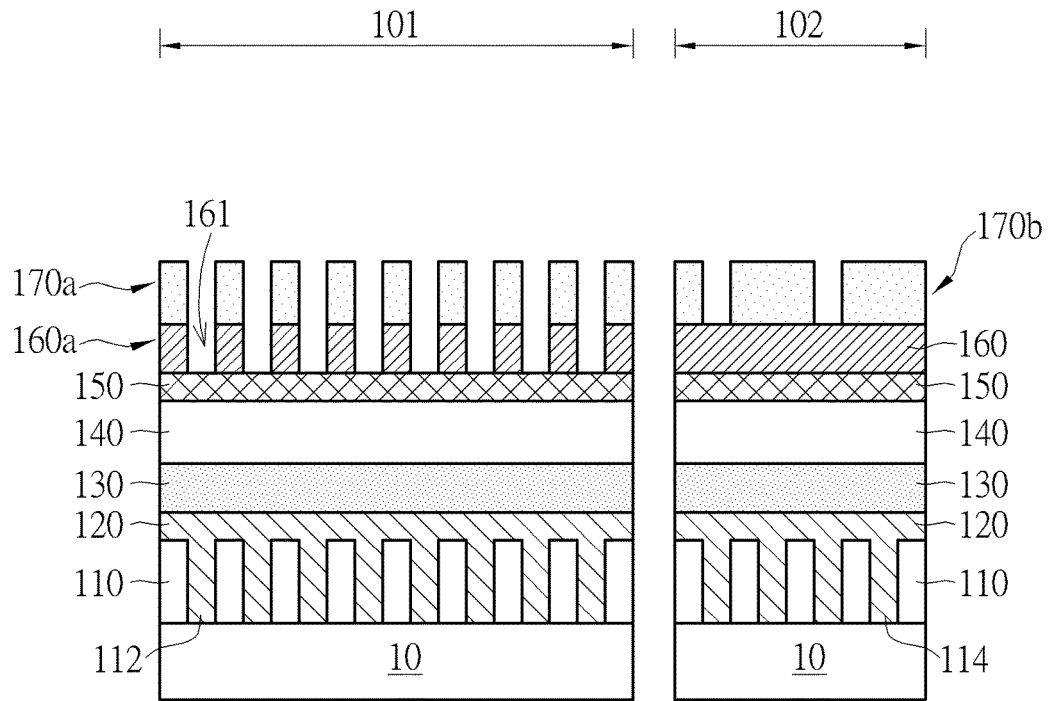

As shown in FIGS. 7A and 7B, using the photoresist pattern 500a as an etching hard mask, a anisotropic dry etching process is performed to etch the anti-reflection coating layer 490, the organic dielectric layer 480, and the upper pattern transfer layer 170 in the peripheral region 102, thereby forming a first peripheral mask pattern 170b.

Figure 8A:
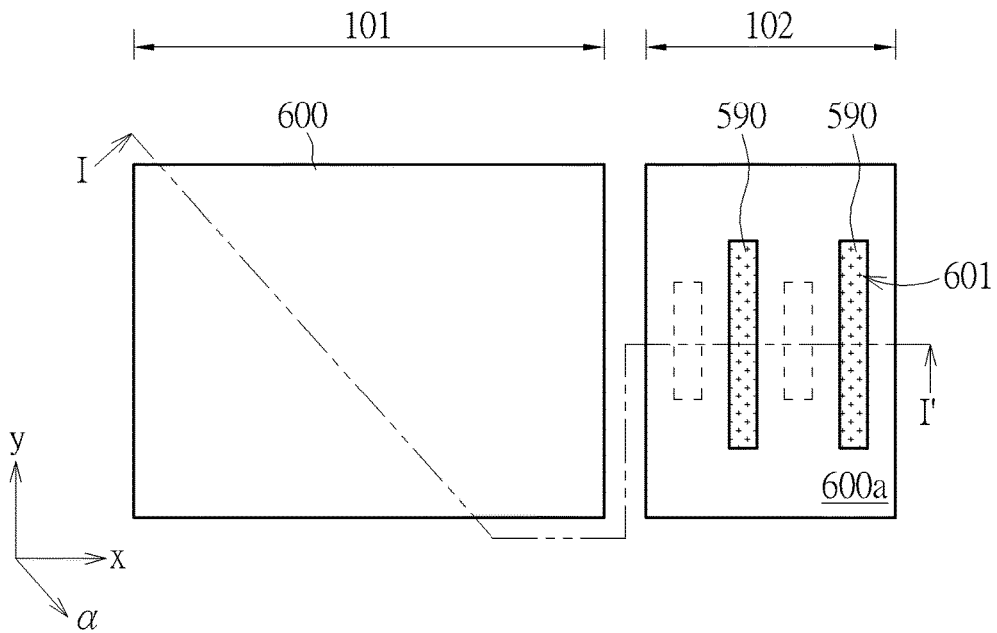
Figure 8B:
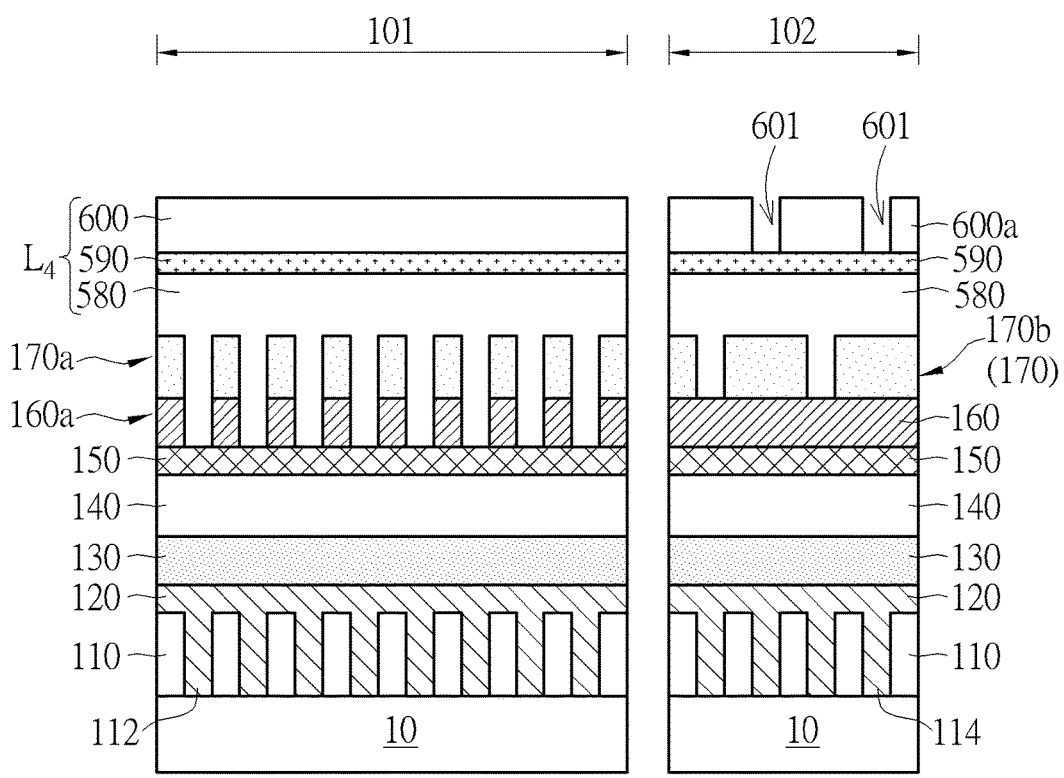

As shown in FIGS. 8A and 8B, a fourth structure layer $L_4$ is formed on the mask stack structure formed in the second SARP process as shown in FIG. 5A and FIG. 5B, and on the first peripheral mask pattern 170b in the peripheral region 102. Likewise, the fourth structure layer $L_4$ may comprise an organic dielectric layer 580 on the upper pattern mask 170a in the cell array region 101 and on the first peripheral mask pattern 170b in the peripheral region 102, a bottom anti-reflection coating layer 590 on the organic dielectric layer 580, and a photoresist layer 600 on the bottom anti-reflection coating layer 590.

By performing a lithographic process, a photoresist pattern 600a is formed within the peripheral region 102. The photoresist pattern 600a includes openings 601 that define a second feature pattern in the peripheral region 102. The second feature pattern may be disposed in proximity to the first feature pattern defined in the first peripheral mask pattern 170b when viewed from above.

Figure 9A:
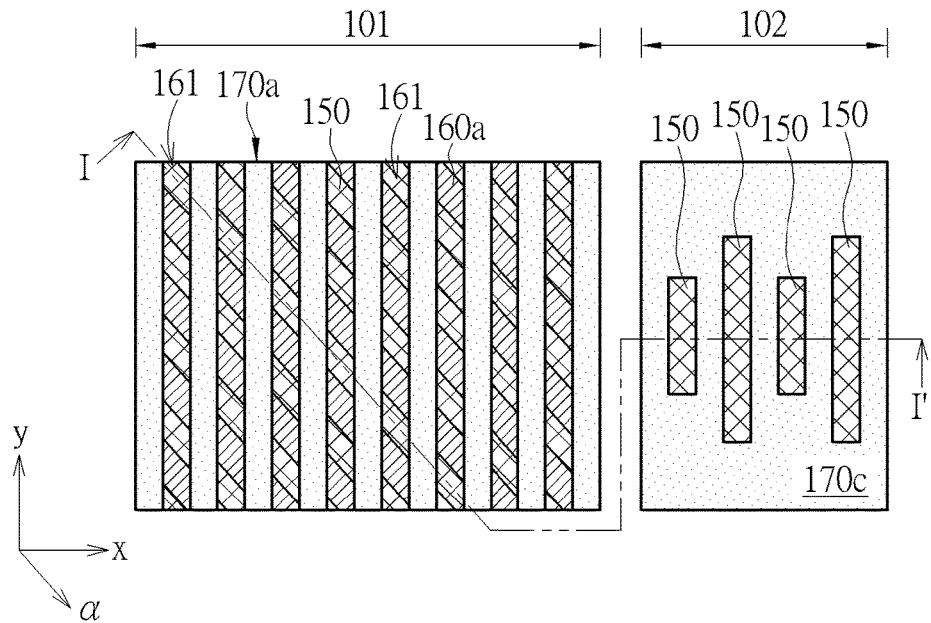
Figure 9B:
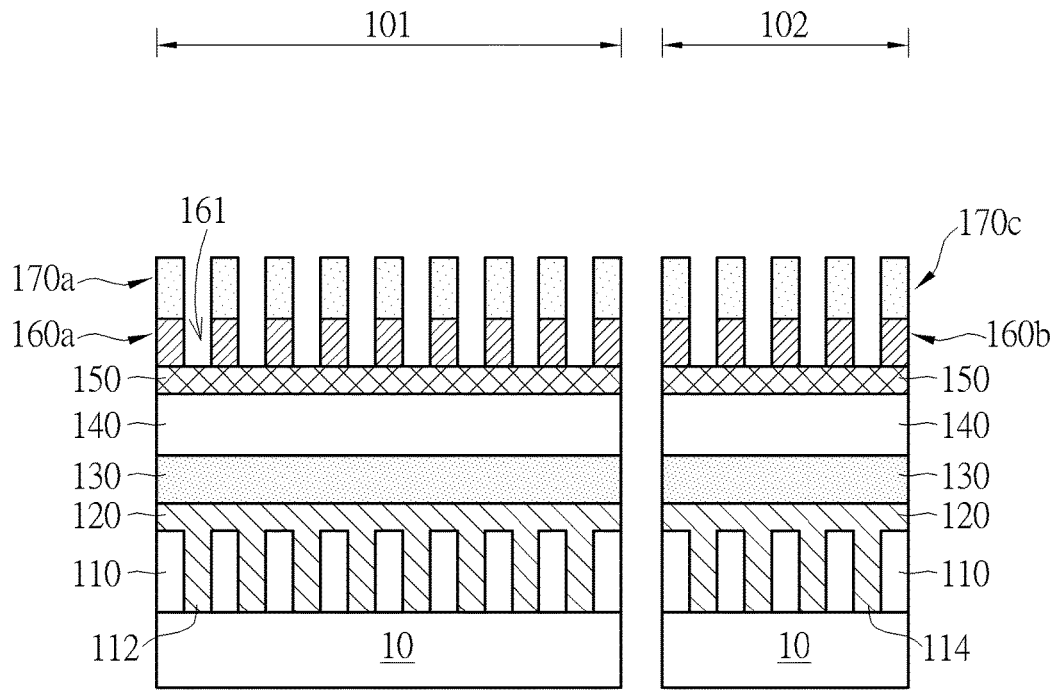

As shown in FIGS. 9A and 9B, using the photoresist pattern 600a as an etching hard mask, an anisotropic dry etching process is performed to etch the anti-reflection coating layer 590, the organic dielectric layer 580, and the upper pattern transfer layer 170 in the peripheral region 102, thereby forming a second peripheral mask pattern 170c in the peripheral region 102. The second peripheral mask pattern 170c is then transferred to the underlying lower pattern transfer layer 160 in the peripheral region 102, to thereby form a third peripheral mask pattern 160b in the peripheral region 102. Thereafter, the remaining fourth structure layer $L_4$ is removed to reveal the mask stack structure in the cell array region 101.

FIG. 10 to FIG. 13 illustrate the steps for transferring the array of hole patterns 161 in the cell array region and the third peripheral mask pattern 160b into the target layer 120 by using a reverse tone patterning method.

Figure 10A:
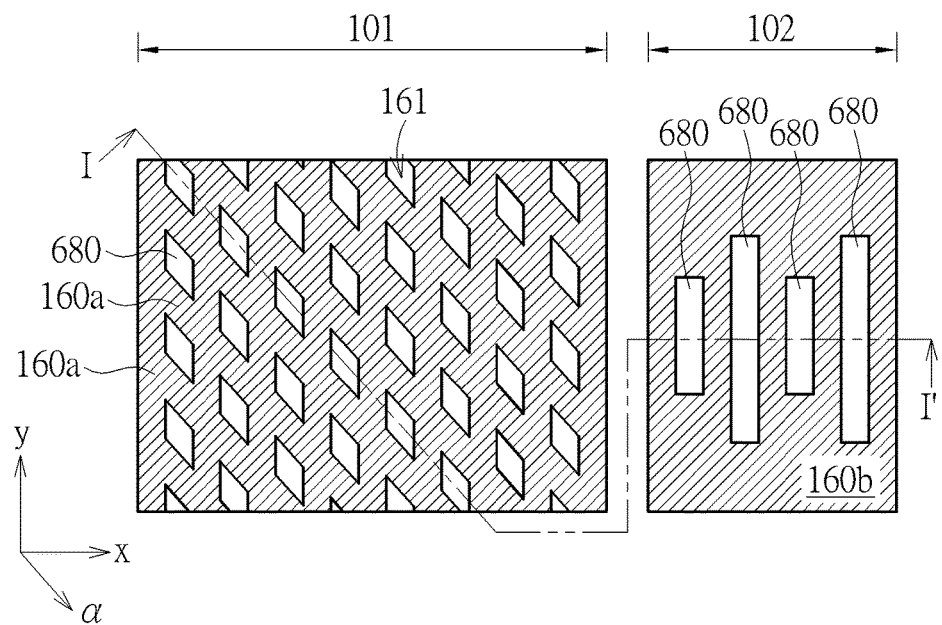
Figure 10B:
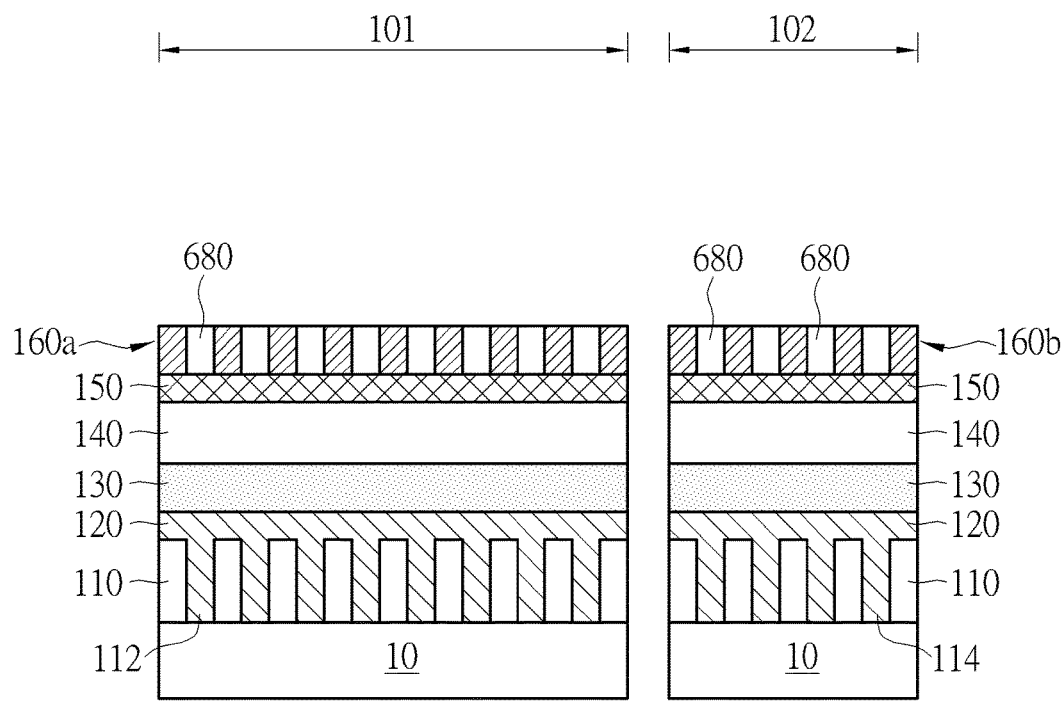

As shown in FIG. 10A and FIG. 10B, the array of hole patterns 161 in the cell array region 101 and the openings defined by the third peripheral mask pattern 160b in the peripheral region 102 are filled with an organic dielectric layer. The organic dielectric layer 680, the upper pattern mask 170a, and the second peripheral mask pattern 170c are etched back until the lower pattern mask 160a in the cell array region 101 and the third peripheral mask pattern 160b are exposed.

Figure 11A:
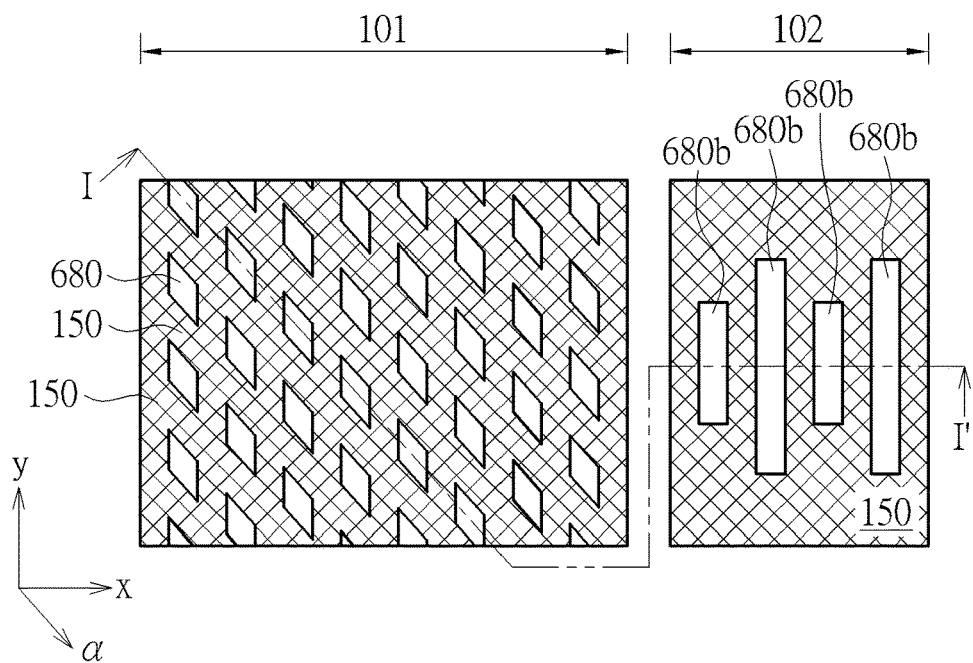
Figure 11B:
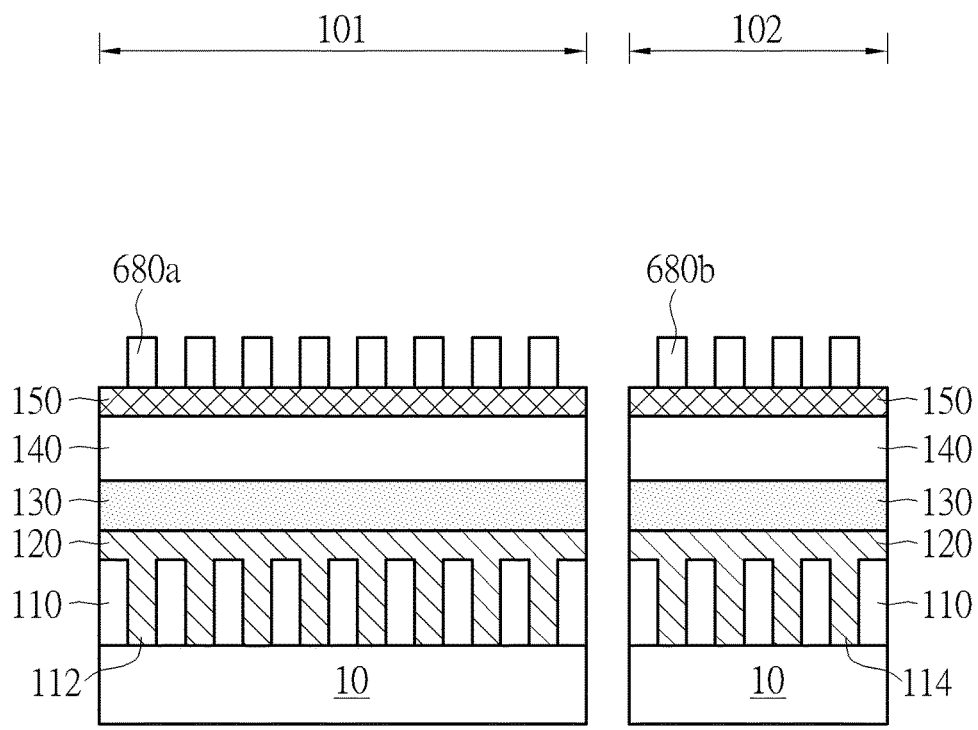

Next, as shown in FIG. 11A and FIG. 11B, the lower pattern mask 160a and the third peripheral mask pattern 160b are removed, leaving remnants of the organic dielectric layer 180 on the hard mask layer 150 to form island patterns 680a and 680b.

Figure 12A:
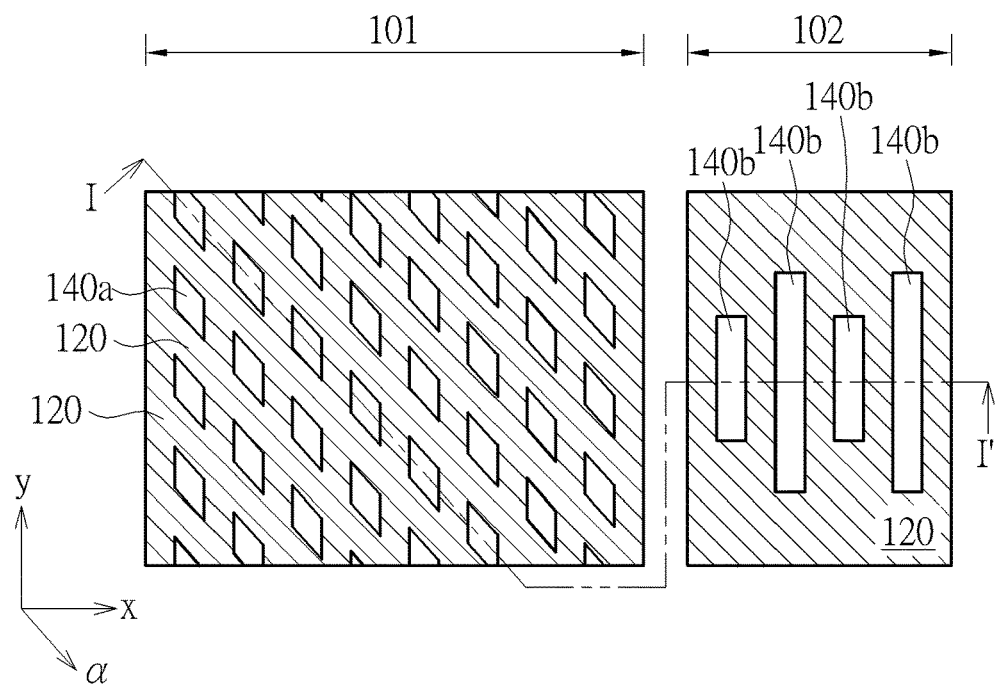
Figure 12B:
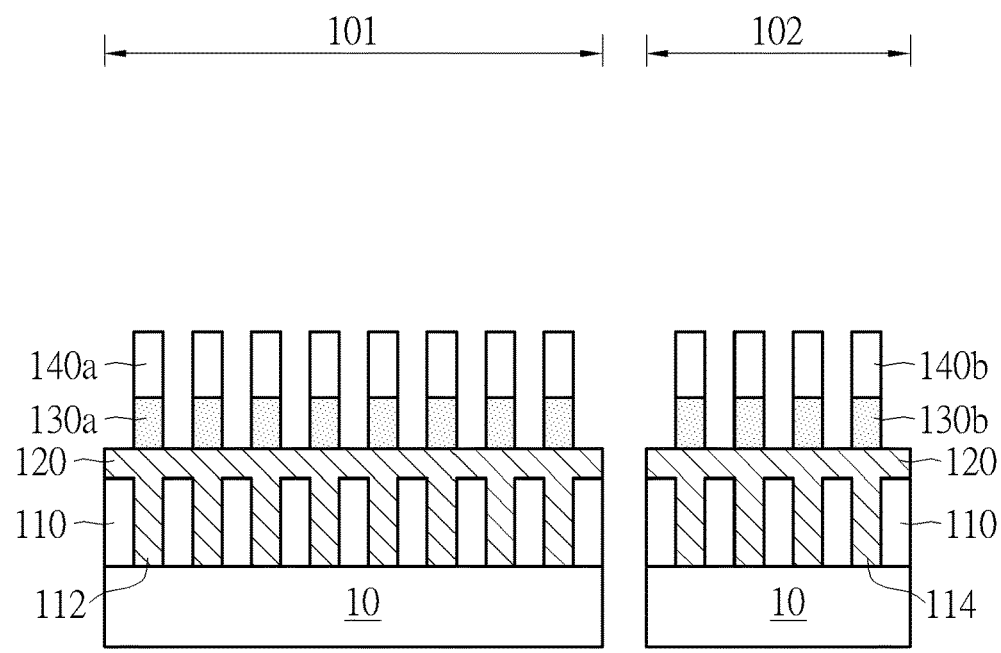

As shown in FIG. 12A and FIG. 12B, using the island patterns 680a and 680b as an etching hard mask, an anisotropic dry etching process is performed to pattern the hard mask layer 130 into hard mask patterns 130a and 130b. During the anisotropic dry etching process, the advanced patterning film 140 is also etched into patterns 140a and 140b directly on the hard mask patterns 130a and 130b, respectively.

Figure 13A:
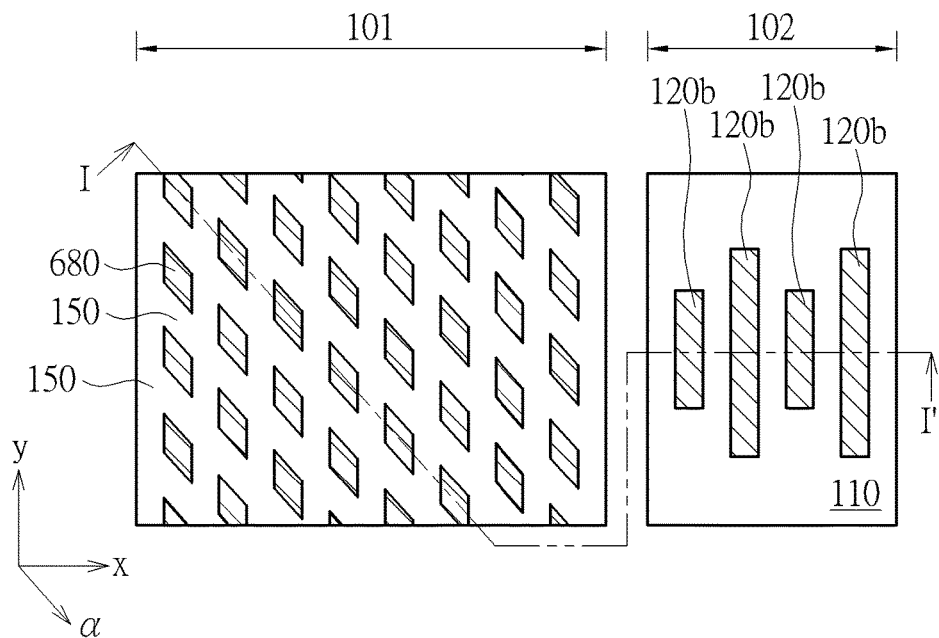
Figure 13B:
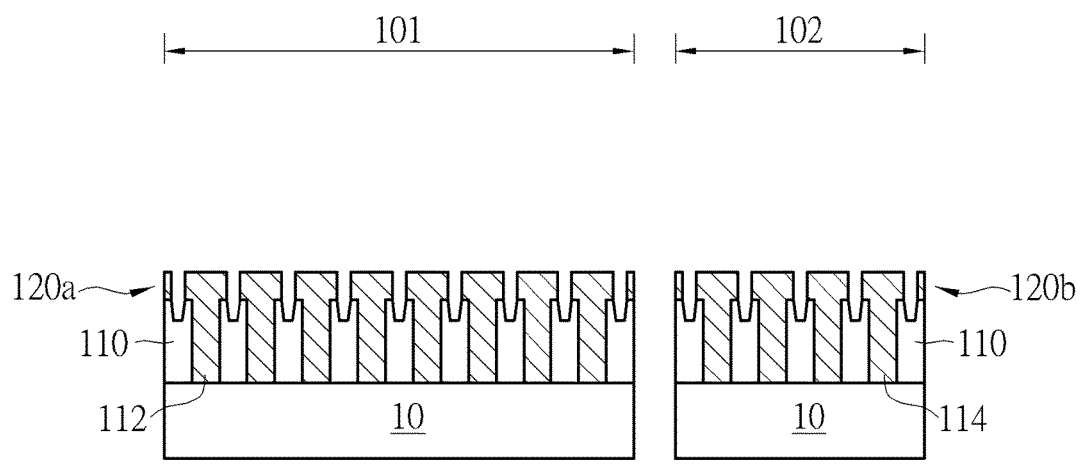

As shown in FIGS. 13A and 13B, using the hard mask patterns 130a and 130b as an etching hard mask, an anisotropic dry etching process is performed to pattern the target layer 120 into target patterns 120a in the cell array region 101 and target patterns 120b in the peripheral region 102. The remaining hard mask patterns 130a and 130b may be removed. According to one embodiment, the target patterns 120a in the cell array region 101 may function as storage node pads. The target patterns 120a and 120b are formed directly on the inter-layer dielectric layer 110, and the target patterns 120a and 120b may be electrically coupled to the contact elements 112 and 114, respectively.

Figure 24:
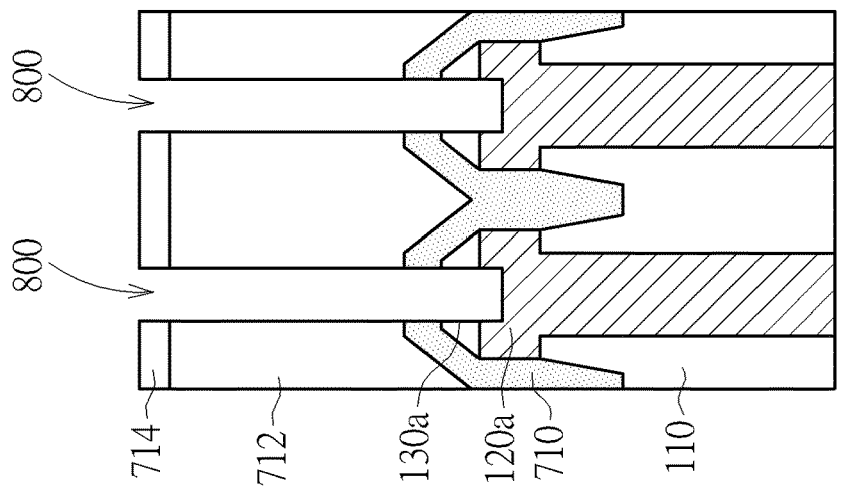
FIG. 22 to FIG. 24 illustrate an exemplary method for forming storage node openings on the storage node pads in the cell array region.
Figure 23:
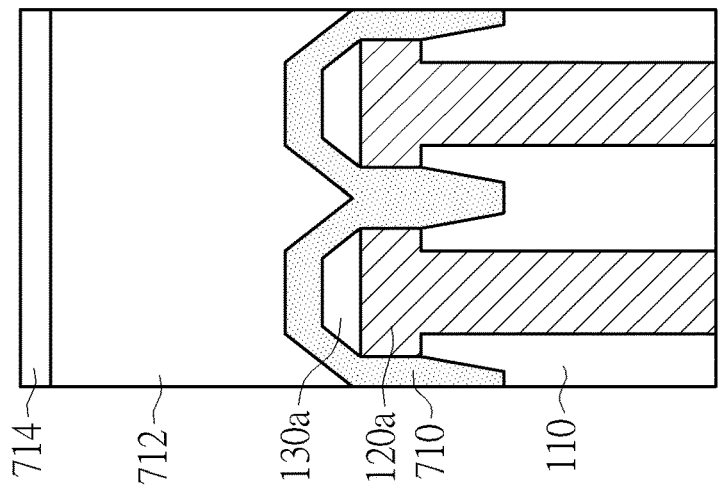
Figure 22:
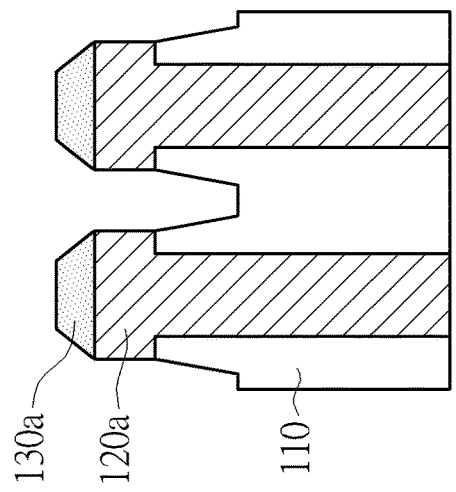

According to another embodiment of the invention, the remaining hard mask patterns 130a and 130b may be kept in the semiconductor structure. FIG. 22 to FIG. 24 illustrate an exemplary method for forming storage node openings on the storage node pads in the cell array region. As shown in FIG. 22, after the patterning of the storage node pads or target patterns 120a in the cell array region 101, the remaining hard mask patterns 130a are not removed.

As shown in FIG. 23, subsequently, an etch stop layer 710 such as SiCN is conformally deposited on the target patterns 120a and the remaining hard mask patterns 130a. A dielectric layer 712 such as SiN is then deposited on the etch stop layer 710, and a cap dielectric layer 714 is deposited on the dielectric layer 712.

As shown in FIG. 24, a lithographic process and a dry etching process are performed to etch the cap dielectric layer 714, the dielectric layer 712, the etch stop layer 710, and the remaining hard mask patterns 130a directly on the target patterns 120a in the cell array region 101, thereby forming storage node openings 800.

It is advantageous to keep the remaining hard mask patterns 130a directly on the target patterns 120a in the cell array region 101, because this improves the punch through window when forming the storage node openings 800 and also improves the storage node bottom stress stability.

FIG. 25 to FIG. 29 illustrate various shapes of the storage node pads in the cell array region 101 according to embodiments of the invention. As shown in FIG. 25, when viewed from the above, the storage node pads or target patterns 120a in the cell array region 101 may have hexagonal-packed pattern, and each of the storage node pads or target patterns 120a may have a rhombus shape.

As shown in FIG. 26, when viewed from the above, the storage node pads or target patterns 120a in the cell array region 101 may have hexagonal-packed pattern, and each of the storage node pads or target patterns 120a may have a circular shape.

As shown in FIG. 27, when viewed from the above, the storage node pads or target patterns 120a in the cell array region 101 may have hexagonal-packed pattern, and each of the storage node pads or target patterns 120a may have an oval shape or ellipse shape.

As shown in FIG. 28, when viewed from the above, the storage node pads or target patterns 120a in the cell array region 101 may have hexagonal-packed pattern, and each of the storage node pads or target patterns 120a may have a square shape.

As shown in FIG. 28, when viewed from the above, the storage node pads or target patterns 120a in the cell array region 101 may have hexagonal-packed pattern, and each of the storage node pads or target patterns 120a may have a square shape with four rounded corners.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method, comprising:
providing a substrate having thereon an inter-layer dielectric layer, a target layer on the inter-layer dielectric layer, a hard mask layer on the target layer, an advanced patterning film on the hard mask layer, a lower pattern transfer layer on the advanced patterning film, and an upper pattern transfer layer on the lower pattern transfer layer, wherein the advanced patterning film is made of amorphous carbon layer;
patterning the upper pattern transfer layer into an upper pattern mask on the lower pattern transfer layer, wherein the upper pattern mask comprises straight-line shaped patterns extending along a first direction;
after patterning the upper pattern transfer layer into the upper pattern mask, patterning the lower pattern transfer layer into a lower pattern mask, wherein the lower pattern mask comprises straight-line shaped patterns extending along a second direction, wherein the second direction is not perpendicular to the first direction, wherein the upper pattern mask and the lower pattern mask together define an array of hole patterns;
after forming the upper pattern mask and the lower pattern mask, filling the array of hole patterns with an organic dielectric layer;
etching back the organic dielectric layer and the upper pattern mask until the lower pattern mask is exposed;
removing the lower pattern mask, leaving remnants of the organic dielectric layer on the hard mask layer to form island patterns;
using the island patterns as an etching hard mask to pattern the hard mask layer into hard mask patterns; and
using the hard mask patterns as an etching hard mask to pattern the target layer into a plurality of target patterns, wherein an elongated top portion of each said target pattern is wider than a remaining bottom portion thereof, and a top portion of the inter-layer dielectric layer has a sunkened middle section.

2. The patterning method according to claim 1, wherein the lower pattern transfer layer comprises poly silicon.

3. The patterning method according to claim 2, wherein the upper pattern transfer layer comprises silicon nitride.

4. The patterning method according to claim 1, wherein the hard mask layer comprises silicon nitride.

5. The patterning method according to claim 1, wherein the target layer comprises tungsten.

6. The patterning method according to claim 1, wherein said patterning the upper pattern transfer layer into an upper pattern mask on the lower pattern transfer layer comprises:
forming a first structure layer on the upper pattern transfer layer;
performing a lithographic process and an etching process to pattern the first structure layer into first straight line-shaped structure patterns extending along the first direction;
forming first spacers on sidewalls of the first straight line-shaped structure patterns, respectively;
removing the first straight line-shaped structure patterns;
using the first spacers as an etching hard mask to pattern the upper pattern transfer layer into the upper pattern mask; and
removing the first spacers.

7. The patterning method according to claim 6, wherein the first structure layer comprises an organic dielectric material.

8. The patterning method according to claim 7, wherein the first spacers comprise silicon oxide.

9. The patterning method according to claim 6, wherein said patterning the lower pattern transfer layer into a lower pattern mask comprises:
   forming a second structure layer on the upper pattern mask;
   performing a lithographic process and an etching process to pattern the second structure layer into second straight line-shaped structure patterns extending along the second direction;
   forming second spacers on sidewalls of the second straight line-shaped structure patterns, respectively;
   removing the second straight line-shaped structure patterns;
   using the second spacers and the upper pattern mask as an etching hard mask to etch the lower pattern transfer layer, thereby forming the lower pattern mask; and
   removing the second spacers.

10. The patterning method according to claim 1 further comprising:
    providing an anti-reflection layer on the advanced patterning film.

11. The patterning method according to claim 10, wherein the anti-reflection layer comprises silicon oxy-nitride.

12. The patterning method according to claim 1, wherein the substrate comprises contact elements in the inter-layer dielectric layer.

13. The patterning method according to claim 12, wherein the target patterns are formed directly on the inter-layer dielectric layer, and wherein the target patterns are electrically coupled to the contact elements, respectively.

\* \* \* \* \*